March 24, 1964 J. F. RICH 3,125,803
MANUFACTURE OF SEMICONDUCTOR DEVICES
Filed Oct. 24, 1960
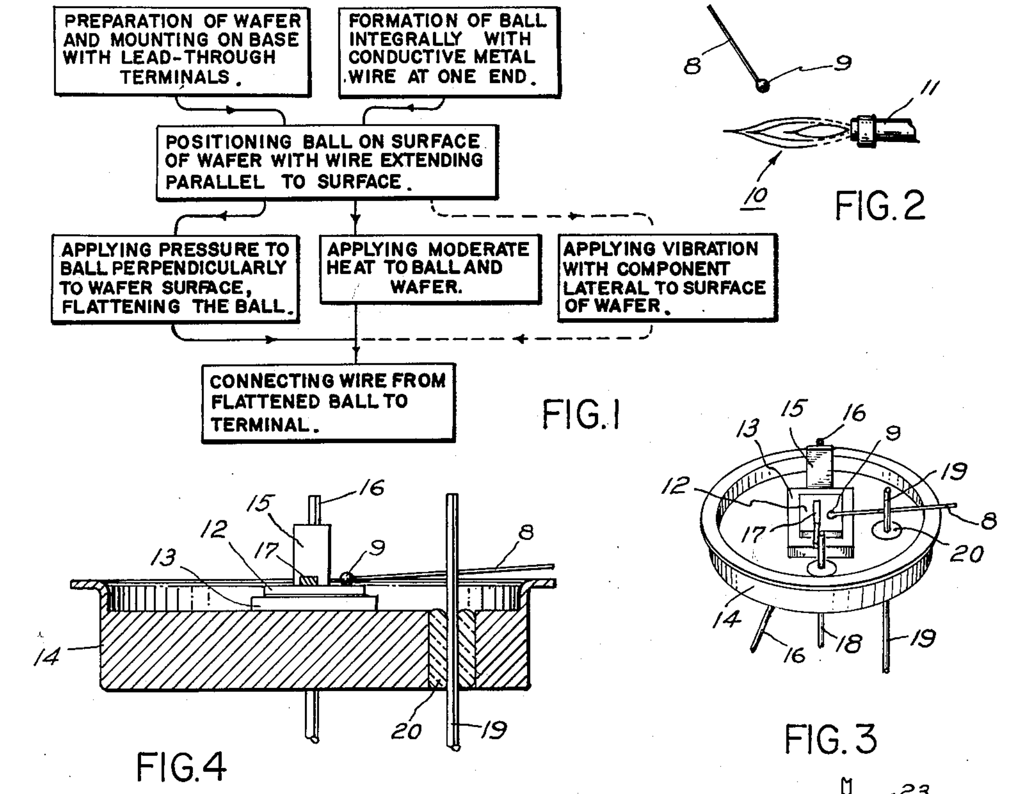
FIG. 1, FIG. 2, FIG. 3, FIG. 4
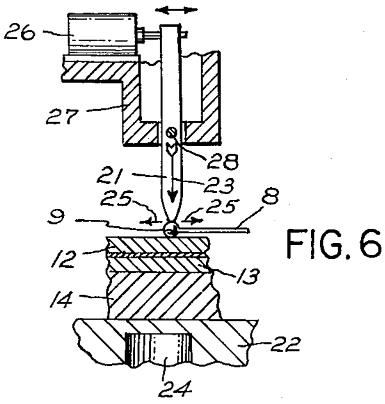
FIG. 6
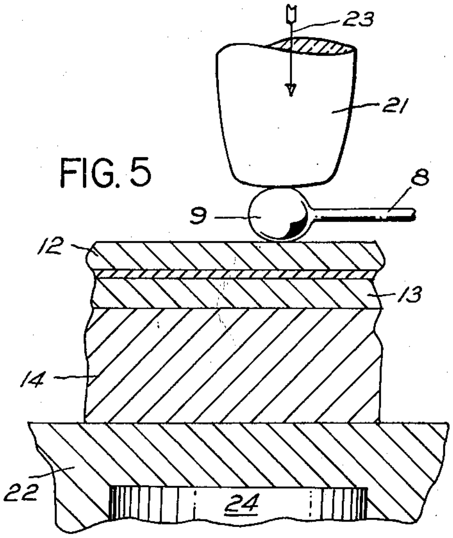
FIG. 5
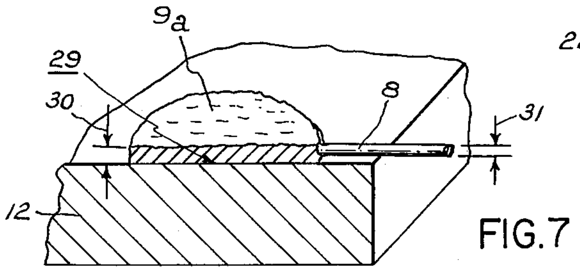
INVENTOR.
JOSEPH F. RICH
BY
Dike, Thompson & Bronstein
ATTORNEYS

3,125,803
MANUFACTURE OF SEMICONDUCTOR DEVICES

Joseph F. Rich, Stoneham, Mass., assignor to Solid State Products, Inc., Salem, Mass., a corporation of Massachusetts Filed Oct. 24, 1960, Ser. No. 64,533
4 Claims. (Cl. 29—482)

The present invention relates to improvements in the manufacture of electrical semiconductor devices and, in one particular aspect, to a novel and improved method of fabricating electrical semiconductor devices with bonded electrical contacts.

In the manufacture of semiconductor devices, such as miniature transistors, rigorous electrical and mechanical requirements must be satisfied by the fabricated connections between the semiconductor material and its attached electrodes. Commonly, at least one of the electrical leads must make a precise contact with the semiconductor within a discrete and minute site along its surface, while at the same time the connection must be of substantial physical strength and yet must introduce no disruptive electrical or mechanical faults. Electrical current-carrying capacity generally should be as large as possible, which demands a low-resistance bonding between the materials of the lead and semiconductor wafer, and the bond must also be one which will withstand elevated temperatures and does not separate under severe environmental conditions of shock and vibration.

As is well known, electrode leads have been affixed to semiconductors through alloying and soldering techniques. These render the semiconductor susceptible to contamination, are likely to be disturbed by high temperatures, and involve troublesome and costly surface preparations as well as great delicacy and skill in the formation of the connections. A further technique has involved the simultaneous application of heat and pressure to the parts which are to be joined, resulting in a bond between the metallic lead and the semiconductor material. However, the junctures formed in the latter manner tend to have disappointingly low mechanical strength, and the deformation of the relatively soft lead wires resulting from application of pressures sufficient to cause the bonding is a source of mechanical weakness which promotes fracture of the leads under impact and vibration conditions. According to one aspect of the present teachings, these difficulties are overcome by applying only relatively low heat, as a juncture is created, and by simultaneously directing only relatively low pressure upon a specially-shaped end of the lead wire which is being affixed to the semiconductor element, the pressure and shaping together effecting a merging and high-strength low-resistance locking of the semiconductor and lead wire materials upon occurrence of a spreading deformation of the shaped end, and the structural integrity of the lead wire itself remaining unimpaired.

Therefore, it is one of the objects of the present invention to provide improvements in the manufacture of electrical semiconductor devices whereby high-strength low-resistance electrical connections to semiconductor material are produced rapidly and with high precision and at low cost.

A further object is to provide a novel and improved method of making semiconductor devices having bonded miniature electrode connections of large current-carrying capacity, high mechanical strength, imperviousness to chemical attack, and ability to withstand high thermal shocks.

In addition, an object is to provide an improved method of fabricating transistors and the like wherein miniature electrodes are readily attached to semiconductor surfaces under bonding conditions involving relatively low temperature and pressure and wherein low resistivity and increased physical strength of connections results from deformations of uniquely-proportioned but easily-fashioned ends of the electrode leads.

By way of a summary account of practice of this invention in one of its aspects, a transistor sub-assembly is fabricated such that a wafer or dice of silicon or other semiconductor material is mounted upon a base, which may comprise one part of an intended enclosure, with a substantially planar semiconductor surface exposed to accept electrical contacts within certain areas. A fine conductive wire, of gold, for example, which is to serve as one electrode and lead-wire connection to a terminal pin, is cut to a short length and one end is heated by a flame until an integral ball end is formed by melting and ensuing surface tension effects, whereupon the ball end is cooled to ambient atmospheric temperature and solidified with the remainder of the smaller-diameter fine wire projecting radially outwardly from it. Thereafter, the ball end is rested directly against the exposed surface area of the semiconductor wafer where an electrode connection is to be made, making a substantially point contact with that surface, and with the fine wire projecting laterally of the wafer and generally parallel to its exposed surface. Sufficient heat is then applied to raise the temperature of the wafer and contacting part of the ball above about 300° C., and a relatively blunt pointed instrument, having no materials which would contaminate the semiconductor assembly, gradually applies sufficient pressure between the ball and wafer to flatten the ball to a thickness about equal to the diameter of the fine wire. Vibration having components of minute amplitude in directions laterally of the semiconductor surface is superimposed, through the pointed instrument, while the flattening pressure is maintained to secure optimum bonding.

The subject matter regarded as my invention is particularly pointed out and distinctly claimed in the concluding portion of this specification. However, as to the theory and details of preferred practices, and further in relation to objects and advantages thereof, this invention may best be understood through reference to the following description taken in connection with the accompanying drawings, wherein:

FIGURE 1 is a block diagram setting forth a process for the practice of this invention;

FIGURE 2 illustrates the flame-forming of a ball-ended miniature electrode in accordance with the present teachings;

FIGURE 3 provides a pictorial view of a transistor sub-assembly at an initial stage of an electrode-bonding process;

FIGURE 4 is a partly cross-sectioned and enlarged view of the transistor sub-assembly portrayed in FIGURE 3;

FIGURE 5 is a cross-sectioned enlargement of part of a transistor sub-assembly together with a heating element and pressing instrument shown as the improved bonding process commences;

FIGURE 6 provides a cross-sectioned view of part of a transistor sub-assembly experiencing electrode-bonding effects including effects of vibration applied through the pressing instrument; and FIGURE 7 depicts a cross-sectioned enlargement of a completed juncture made between a fine-wire connecting lead and a semiconductor wafer in accordance with these teachings.

In the fabrication of electrical semiconductor devices, a diminutive wafer or dice of material such as germanium or silicon is first prepared in a known manner and is then ordinarily mounted upon a base or so-called "header" which is to serve as part of a hermetic enclosure, thereby forming a sub-assembly which lends itself to convenient handling during subsequent manufacturing steps. Particularly where the device is a transistor having a number of electrical connections, this base also commonly includes insulated lead-through terminals to which the needed electrode contacts with the semiconductor surfaces may be connected and to which, in turn, the external circuit connections may be made. It is commonly required that certain electrodes of some of these devices be minute and that they be easily and securely attached to the exposed surfaces of the semiconductor material along prescribed areas with a high degree of precision and without impurity contamination or undue risk of thermal or mechanical injury to the semiconductor assembly. The alloying and compression-bonding techniques used heretofore in making such electrode attachments are not fully satisfactory in the respects noted, and in overcoming their deficiencies according to this invention it is important that the extremely fine metal lead wire which is to be affixed as an electrode and connected to a terminal first be formed with an enlarged integral end. A short length of such fine-diameter conductive wire 8, is illustrated in an enlargement in FIGURE 2, with an integral ball-shaped end 9 already formed. Conveniently, the short length of wire is cut from a much greater length of commercially-available gold wire, or relatively soft conductive wire of silver or aluminum, or their alloys, and the one end which is to be provided with the enlargement is progressively inserted into a clean flame 10 which is of a sufficiently high temperature to cause its melting at that end. As the melting occurs, surface tension effects draw the molten metal into a generally spherical globule, and the size of this globule increases as more of the wire is inserted into the melting heat of the flame. This action is continued until a desired size of globule is reached, for the intended electrode application, and is then terminated by withdrawing the wire from the flame and permitting it to cool to ambient room temperature, before the molten globule can develop a mass which would cause it to drop from the end of the wire. Upon cooling, the solidified end mass 9 is found to remain substantially spherical, and the integral fine-diameter wire 8 projects substantially radially outwardly from it, both of which factors are advantageous in the processing described later herein. Because semiconductors tend to become contaminated by certain impurities, the flame 10 is preferably created by an alcohol torch 11 and is preserved clean of materials which would introduce such impurities. Other known sources of heat meeting the same purity requirements may be substituted, although the simple alcohol torch flame has obvious advantages. In those instances when contaminants are left after the heating, a known cleaning operation such as a chemical cleaning may be performed to remove these from the shaped conductor.

A sub-assembly of the type referred to appears in FIGURES 3 and 4, wherein a semiconductor wafer 12 is soldered to a thermally-conductive mounting block 13 and the latter is in turn fastened to and supported about centrally of the cup-shaped header 14. Ribbon connector 15, which may serve as the collector electrode of a transistor, is shown in electrical contact with the bottom surface of the wafer 12 and also in electrical contact with a stiffer lead-through terminal 16. Similarly, a further elongated electrode 17 is attached to the upper exposed surface of the semiconductor wafer and to lead-through terminal 18. The electrode connection remaining to be made upon this sub-assembly is that between a part of the exposed upper surface of semiconductor wafer 12 and the third lead-through terminal 19. Glass bead insulator 20 separates the header 14 from terminal 19, the other tenminals being similarly insulated.

The wafer having been prepared and mounted upon the base with the lead-through terminals, and a ball end having been formed integrally with the fine conductive wire which is to serve as an electrode connection, the ball end 9 of that wire is then rested upon the exposed upper semiconductor surface, making substantially a point contact with the flat wafer surface, with the fine wire 8 extending laterally outwardly toward the appropriate terminal 19 in substantially parallel relationship to the wafer surface. The desired area of contacting may be readily selected by manipulating the wire with the aid of a tool, such as tweezers. Semiconductor surfaces are normally relatively clean at this stage of manufacture, and while in other processes it is nevertheless necessary to subject the semiconductor surface to further special cleaning or to plating by a troublesome vaporizing process, these further steps can be entirely eliminated in practice of the present invention. Such plating or coatings as may be applied over the semiconductor material for other reasons, such as a vaporized coating which protects against etching acids used in later processing, may actually be engaged by the ball end of the wire when it is rested upon the wafer surface, but the intended connection results nevertheless. Once the ball-ended wire is positioned directly upon the wafer, at the intended site of an electrode connection, a rather blunt pointed tool or stylus 21 is moved into engagement with the top of the ball 9, applying pressure to the relatively soft metal of the ball and preserving it in engagement with the wafer surface, as shown in the FIGURE 5 enlargement. For these purposes, the header 14 is first rested upon a relatively stationary platen 22 which preserves the needed restraint of the wafer. It is often preferred that the electrode be attached to the wafer before the latter is mounted upon a header, and in such instances the wafer itself is of course rested upon the platen directly.

Downward movement of the stylus 21 is in the direction of arrow 23, normal to the surface of wafer 12, and is first sufficient to enable the stylus to deform the ball 9 slightly and thereby hold it in position. Thereafter, the forces applied by the stylus are increased so that the pressures appearing between the bottom of the ball and the adjoining top surface of the wafer are sufficient to cause an intimate bonding between their materials. At ambient room temperatures, the pressures which would be needed to create a firm bonding tend to be so high that the somewhat brittle thin germanium or silicon wafer is likely to fracture and render the device useless. Therefore, for the purpose of reducing the pressures required, as well as for the further purpose of promoting a more intimate intermetallic bonding between the semiconductor and electrode materials, the temperatures of the wafer and ball are increased to a moderate level which does not, however, have deleterious effects upon the remainder of the sub-assembly. Suitable temperatures are about 250–300° C., or slightly higher. These temperatures are conveniently produced by an electrical heater, which may be in the form of a small cylindrical cartridge 24 set into the platen 22 and heating the wafer, and, in turn, the ball, through the header 14. Heat is applied in this manner concurrently with the application of pressure by the stylus, and suitable pressures are then found to be only somewhat in excess of 10,000 pounds per square inch, such as 16,000 pounds per square inch, for example. The combined heat and pressure effects, and their duration, are small enough to avoid a conventional melting of the electrode, the latter being undesirable because unwanted alloying with the semiconductor material would then occur and would alter the electrical characteristics of the semiconductor, as by short-circuiting a thin surface layer of a distinctive type of conductivity.

As the heat and increasing pressure are applied, the ball end 9 of wire 8 tends to deform and spread until it is substantially flat, whereupon a remarkably secure bonding is achieved between the semiconductor and electrode. In this process, the ball which originally made a substantially point contact with the semiconductor surface is caused to seize with the semiconductor material, and the seizure takes place over progressively greater area as the pressurized deformation increases. It is believed that the material of the ball, being softer than that of the semiconductor wafer, undergoes movement in the nature of flow in the radial directions along the wafer surface from the original point of ball contact, and that such movement or flow under pressure is responsible for the highly improved locking which occurs between the two materials. Flattening pressure is applied only until the ball has been reduced to about the thickness of the integral wire 8, and is then discontinued. Wire 8 is thereafter connected to terminal 19 in a known manner, as by a welding technique, with the excess wire being removed by cutting. Preferably, the juncture between ball end 9 and semiconductor wafer 12 is formed while they are maintained in an inert surrounding atmosphere, such as a nitrogen atmosphere, which insures that oxides will not develop at the temperatures involved. Hard stylus 21 is preferably of quartz, sapphire, or the like, which does not tend to adhere to the metal of ball 9, possesses no impurity materials, and has a low thermal conductivity which prevents the applied heat from being too rapidly withdrawn from the intended site.

In a preferred practice of the invention, minute directional vibrational movements are induced between the materials of the semiconductor and ball as the moderate pressure and heat are applied. Such vibration is applied with at least a component lateral to the surface of the wafer, as represented by arrows 25 in FIGURE 6, whereby the aforesaid locking effects are even more significantly improved. Amplitude of the vibration need only be small and scarcely perceptible, and is in any event small in relation to the diameter of the ball 9; it is conveniently introduced through the stylus 23, rather than through the header, so that tendencies toward fracture of the wafer are minimized. As illustrated, the stylus assembly includes a simple solenoid-type electrical vibrator 26 having its movable armature coupled with the stylus and vibrated at a frequency not in excess of ultrasonic, such as the standard 60 cycle frequency of the electrical supply to the vibrator, although higher frequencies in the ultrasonic range up to 500,000 cycles may be used. Both the stylus and vibrator are depicted as mounted upon the movable press assembly 27 which is raised and lowered by mechanisms of conventional form, not shown, and the needed freedom for slight vibrational movement of the stylus is indicated by its support upon a transverse shaft 28. Vibration is commenced after the stylus has first been pressed against ball 9 and is discontinued before the pressurizing is completed. The superimposed lateral vibration is believed to enhance the intermetallic bonding phenomena occurring between the different materials being joined, and it is effective to break up surface oxide layers and films which would impair the bonding. Consequently, the resulting union between the ball-ended electrode wire and semiconductor possesses increased current-carrying capacity and mechanical strength. The latter fact permits the use of electrode wire of significantly greater diameter than would otherwise be the case and constitutes an important advantage.

The FIGURE 7 cross-section of wafer 12 and its affixed electrode *9a*, which may be a transistor base electrode, illustrates the flattening which has occurred and also illustrates that the semiconductor and electrode materials have become intimately engaged along their juncture 29. The surfaces of the smooth-appearing wafer 12 are of course microscopically quite irregular, and it is believed that the lateral pressurized spreading of the softer electrode material outwardly from a contact point, together with the superimposed lateral vibrations in opposite directions, causes the softer electrode material to fill the irregularities and to become so intimately engaged with the wafer surface that a high degree of mechanical locking and molecular adhesion takes place between the materials. Large contact area results, thereby lowering the ohmic resistance of the connection, and voids between the materials are essentially eliminated. The latter fact is of particular importance because even the most minute voids would tend to trap gases and to admit processing acids which could erode and weaken the connection from within, whereas tight sealing between the materials prevents this. Molecular adhesion and mechanical locking effects are also believed to be responsible for the improvement in ability to withstand severe thermal shocks and loads. Thickness 30 of the flattened electrode remains slightly in excess of the diameter 31 of wire 8, the latter being wholly free of any crimping or other deformation which would weaken the connection from the semiconductor to the electrode terminal. Because of the vastly improved mechanical strength of the juncture, wire 8 may be made of large diameter, and hence large current-carrying capacity, and without undue risk that environmental impact and vibration forces will dislodge the electrode. Electrode wires of up to ten thousandths of an inch diameter may thus replace those formerly restricted to a maximum of about two thousandths of an inch, for example.

By way of illustration of the sizes of ball ends and electrodes which may result, it is noted that a ball end having a diameter about three times that of the wire can be formed in the manner described, and the flattened electrode may in turn have a diameter about four to six times that of the wire projecting from it. It is not essential that the electrode wire be of circular cross-section, and it should be understood that other wires, such as those in ribbon form, may similarly be provided with deformable enlargements at their ends for the purpose of producing improved electrode junctures in accordance with these teachings. And, while the ball-shaped enlargement is a preferred one, other configurations may be utilized where they are available. An enlarged mass of relatively soft electrode material at the end of a conductor may also be produced for purposes of this invention by adding material, such as a form of solder, to the end of the conductor, as by dipping it into a molten pool of the soft electrode material. Enlarged ends of electrode wires may also be formed by plating, or may have a plated coating of another material upon them, for protection against chemical attack, for example. The desired flattening may obviously be secured using a stylus which is the equivalent of but shaped differently from that illustrated.

It has been noted hereinabove that in some instances it may be desirable to affix an electrode to a semiconductor wafer surface having a layer of another material upon it which is not a semiconductor, as in the case of a protective vaporized coating. Moreover, the semiconductor material may assume a variety of shapes, including layers, and there may be various combinations of different conductivity types of semiconductor material in one semiconductor device. Further, the semiconductor may be in the form of a separate dice, or may be partly assembled upon a header or the like, when an electrode is applied in practice of this invention. The term "wafer" as used in the appended claims is therefore defined as embracing such constructions.

It should therefore be understood that the disclosures detailed herein are intended to be of a descriptive rather than a limiting character, and that various changes, combinations, substitutions or modifications may be practiced in accordance with these teachings without departing either in spirit or scope from this invention in its broader aspects.

What I claim as new and desire to secure by Letters Patent of the United States is:

1. The method of making an electrical semiconductor device of the type having a wafer including semiconductor material and an electrode electrically and mechanically connected therewith, which comprises forming at the end of a linear conductor and from the material thereof a relatively large and substantially spherical mass of electrode material which is softer than the material of the wafer to which it is to be bonded, positioning said conductor substantially parallel with a surface of the wafer and with the substantially spherical mass extending therefrom abutting the surface of the wafer and making substantially a point contact therewith, heating the wafer and electrode material and simultaneously compressing the substantially spherical mass of electrode material against the surface of the wafer in direction substantially perpendicular therewith until the softer mass of electrode material is flattened to a thickness which is substantially the thickness of the conductor extending therefrom and until the softer electrode material spreads substantially radially outwardly from the point contact and covers a relatively larger substantially circular area of the surface of the wafer, and thereafter cooling and relieving pressure between the electrode and wafer materials.

2. The method of making an electrical semiconductor device of the type having a quantity of semiconductor material and an electrode bonded therewith, which comprises heating and melting the end of a metal wire which is softer than a semiconductor material to which it is to be bonded until surface tension effects produce a relatively large globule of the metal at the end of the wire, cooling the molten globule and wire to form a solidified ball-like end integral with the wire, positioning said wire substantially parallel with a surface of the quantity of of semiconductor material and with the ball-like end extending therefrom abutting the surface of the semiconductor material and making substantially a point contact therewith, heating the ball-like end of the wire and the semiconductor material and simultaneously compressing the ball-like end against the surface of the semiconductor material in direction substantially perpendicular thereto, vibrating at least one of the ball-like end and semiconductor material relative to the other in directions laterally of the surface of the semiconductor material while continuing the heating and compressing until the ball-like end spreads substantially radially outwardly from the point contact and covers a relatively larger substantially circular area of the semiconductor material and is flattened to a thickness which is substantially the thickness of the wire extending therefrom, interrupting the vibrating while continuing the compressing, and thereafter cooling and relieving pressure between the spread end of the wire and semiconductor material.

3. The method of making an electrical semiconductor device as set forth in claim 2, wherein the semiconductor material is selected from silicon and germanium, wherein the metal of said wire includes gold, wherein the heating is to a temperature of about 300° C., wherein the compressing is gradually increased to above about 10,000 pounds per square inch, and wherein the vibrating is performed at a low frequency not in excess of ultrasonic frequencies.

4. The method of making an electrical semiconductor device as set forth in claim 2 wherein the compressing and vibrating are performed by applying pressure and vibration to the ball-like end at a position opposite the point contact with the semi-conductor surface while supporting said semiconductor material relatively stationary.

References Cited in the file of this patent

UNITED STATES PATENTS

| | | |
|---|---|---|
| 2,819,961 | Bartels et al. | Jan. 14, 1958 |
| 2,914,715 | Uhlir | Nov. 24, 1959 |
| 2,985,954 | Jones et al. | May 30, 1961 |
| 3,006,067 | Anderson et al. | Oct. 31, 1961 |
| 3,006,068 | Anderson et al. | Oct. 31, 1961 |
| 3,055,098 | Bratkowski et al. | Sept. 25, 1962 |
| 3,075,282 | McConville | Jan. 29, 1963 |

OTHER REFERENCES

Electronic Technician, September 1957, page 71.

Bell Laboratories Record, April 1958, pages 127–130.